(12) United States Patent
Nedved et al.

(10) Patent No.: US 12,349,317 B2
(45) Date of Patent: Jul. 1, 2025

(54) ELECTRONIC ASSEMBLY HAVING THERMAL PAD WITH POLYMER LAYER

(71) Applicant: DISH Network L.L.C., Englewood, CO (US)

(72) Inventors: Steven Nedved, Littleton, CO (US); Morgan Kirby, Palmer Lake, CO (US); Svitlana Trygubova, Lakewood, CO (US); Henry Gregg Martch, Parker, CO (US)

(73) Assignee: DISH Network L.L.C., Englewood, CO (US)

( * ) Notice: Subject to any disclaimer, the term of this patent is extended or adjusted under 35 U.S.C. 154(b) by 213 days.

(21) Appl. No.: 17/729,174

(22) Filed: Apr. 26, 2022

(65) Prior Publication Data

US 2023/0345675 A1 Oct. 26, 2023

(51) Int. Cl.
*H05K 7/20* (2006.01)

(52) U.S. Cl.
CPC ..... *H05K 7/20454* (2013.01); *H05K 7/20445* (2013.01); *H05K 7/20472* (2013.01)

(58) Field of Classification Search
CPC ..... H05K 7/20454; H05K 1/0203; G06F 1/20
See application file for complete search history.

(56) References Cited

U.S. PATENT DOCUMENTS

| | | | | |
|---|---|---|---|---|
| 6,025,991 A * | 2/2000 | Saito | ................. | H05K 7/20436 |
| | | | | 174/547 |
| 6,644,395 B1 * | 11/2003 | Bergin | ................ | H01L 23/3735 |
| | | | | 361/705 |
| 6,974,045 B1 * | 12/2005 | Trombach | .............. | B65D 51/20 |
| | | | | 215/349 |
| 8,902,588 B2 * | 12/2014 | Ritter | ................. | H05K 7/20445 |
| | | | | 165/185 |
| 9,220,185 B2 * | 12/2015 | Ritter | ...................... | H01L 23/36 |
| 9,265,180 B2 * | 2/2016 | Dernier | .................. | H05K 1/021 |
| 9,485,884 B2 * | 11/2016 | Bose | .................... | H05K 7/2049 |
| 9,668,377 B2 * | 5/2017 | Lim | ..................... | H05K 1/0203 |
| 10,356,948 B2 * | 7/2019 | Trygubova | ........... | H05K 7/2049 |
| 10,721,840 B2 * | 7/2020 | Trygubova | ........... | H05K 5/0004 |
| 11,800,687 B2 * | 10/2023 | Trygubova | ......... | H05K 7/20481 |

(Continued)

OTHER PUBLICATIONS

DLM tech garage video showing unpackaging and installation of a thermal pad onto a heat spreader https://youtu.be/uxaPQQSIvJA?si=wMPKzzkdOVHqRglg (Mar. 2021).*

*Primary Examiner* — Zachary Pape
(74) *Attorney, Agent, or Firm* — Seed IP Law Group LLP

(57) ABSTRACT

An electronic assembly is provided. The electronic assembly includes a heat-spreader component and at least one spring. The electronic assembly further includes a thermal pad contacting the at least one spring, and at least one layer of polymer directly contacting at least one of an upper surface and a lower surface of the thermal pad. Further disclosed is a method of assembling the electronic assembly. The method includes adhering a heat-dissipating sheet on a surface of a metal heat-spreader component. The method also includes placing a thermal pad on at least one spring extending from the surface of the metal heat-spreader component, and placing at least one layer of polymer so as to directly contact at least one of an upper surface and a lower surface of the thermal pad.

17 Claims, 6 Drawing Sheets

(56) References Cited

U.S. PATENT DOCUMENTS

| | | | | |
|---|---|---|---|---|
| 2002/0154487 | A1* | 10/2002 | Weischhoff Van Rijn | H05K 7/2049 |
| | | | | 361/719 |
| 2005/0168941 | A1* | 8/2005 | Sokol | H05K 7/20445 |
| | | | | 361/688 |
| 2007/0211433 | A1* | 9/2007 | Maeno | H05K 7/205 |
| | | | | 361/704 |
| 2011/0122574 | A1* | 5/2011 | Tsunoda | H05K 7/20445 |
| | | | | 361/679.54 |
| 2012/0000910 | A1* | 1/2012 | Ekkert | B65D 53/08 |
| | | | | 220/378 |
| 2015/0037616 | A1* | 2/2015 | Wyatt | H01M 10/613 |
| | | | | 429/153 |
| 2015/0334871 | A1* | 11/2015 | Hill | B32B 27/34 |
| | | | | 156/247 |
| 2016/0150680 | A1* | 5/2016 | Aramaki | H01L 23/3737 |
| | | | | 165/185 |
| 2018/0044480 | A1* | 2/2018 | Shen | C08G 77/62 |

* cited by examiner

ELECTRONIC ASSEMBLY HAVING THERMAL PAD WITH POLYMER LAYER

BACKGROUND

Heat dissipation is a major consideration in electronic assemblies, for example electronic receivers such as set-top boxes. Some set-top boxes have been manufactured or assembled with a graphite sheet within the receiver, which may allow for heat dissipation to be increased.

In addition, thermally conductive pads (otherwise known as thermal pads) are often incorporated into electronic assemblies so as to fill air gaps that are caused by surfaces that could or should otherwise be in thermal contact. Thermal pads may be placed on or near a heat sink to aid a conduction of heat away from a component intending to be cooled, such as a motherboard or some other circuitry.

However, in configurations where a thermal pad and a heat-dissipating sheet such as a graphite sheet are both included within an electronic assembly, some of the layers of the graphite sheet, either during disassembly and replacement of other parts within the receiver or otherwise, may be delaminated which can disadvantageously leave pieces of graphite dispersed throughout the receiver. The sheet itself may also generally degrade. This may occur due to a tackiness of the thermal pad, which may, for example, be stuck to adjacent components with an adhesive disposed thereon. For example, when the receiver is taken apart, the tackiness of the thermal pad may cause a pulling force within parts of the electronic assembly when the electronic assembly is disassembled, causing the graphite sheet to de-layer with one or more layers becoming inadvertently disassembled and sticking, for example, to other parts of the receiver. This will ultimately cause the graphite sheet to become less functional or unusable. Degradation of the graphite sheet may also be particularly problematic because graphite sheets are relatively difficult to replace.

Configurations where such problems are avoided while minimizing the cost and maintaining the effectiveness of the thermal conductivity and appropriate cooling within the electronic receiver are desirable.

SUMMARY

Various embodiments described herein provide apparatuses, systems and methods relating to a configuration and assembly and/or disassembly and/or manufacture of an electronic assembly, for example a set-top box. The set-top box is assembled with a thermal pad and a layer of polymer on at least one face of the thermal pad, adding to ease of manufacture and avoiding disadvantageous degradation of components within the electronic assembly during or after disassembly and/or assembly of the electronic assembly.

According to one embodiment, an electronic assembly is provided. The electronic assembly includes a heat-spreader component and at least one spring. The electronic assembly further includes a thermal pad disposed on the at least one spring, and at least one layer of polymer directly contacting at least one of an upper surface and a lower surface of the thermal pad.

According to one embodiment, a method of assembling an electronic assembly is provided. The method includes adhering a heat-dissipating sheet on a surface of a metal heat-spreader component. The method also includes placing a thermal pad on at least one spring extending from the surface of the metal heat-spreader component, and placing at least one layer of polymer so as to directly contact at least one of an upper surface and a lower surface of the thermal pad.

DETAILED DESCRIPTION OF EMBODIMENTS

Figure 1:
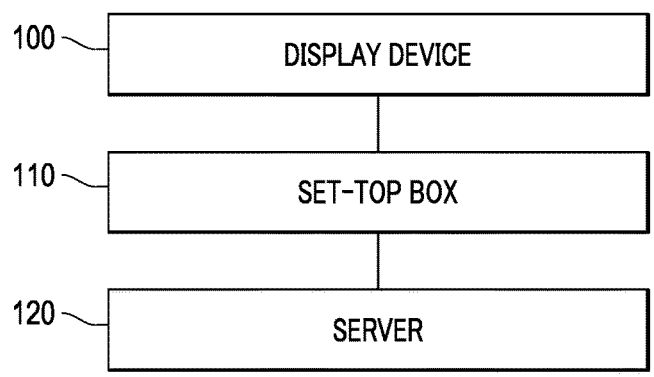
FIG. 1 shows a system according to some embodiments.

Electronic assemblies such as set-top boxes are often used to aid in the transmission of media content from a content provider to a display device. As shown in FIG. 1, the content provider may provide, to a content viewer, a set-top box such as set-top box 110. This set-top box 110 may be configured to receive, store and/or transmit content program to the content viewer, via the display device 100 or otherwise. The set-top box 110 may be communicatively coupled to the display device 100 through any type of wired or wireless connection. Exemplary wired connections include coaxial, fiber, composite video and high-definition multimedia interface (HDMI). Exemplary wireless connections include WiFi and Bluetooth. In at least one embodiment, the set-top box 110 may be embodied in a television converter device (e.g., a satellite television receiver). The set-top box 110 may also be incorporated into the display device 100. The set-top box 110 should not be limited and can be any device which is capable of receiving data streams and processing and managing presentation of such data streams on the presentation device, including a computer, server, streaming players (Apple TV, Roku, etc.), or other similar device.

In some embodiments, the set-top box 110 includes a digital video recorder (DVR) and/or recording capabilities. The set-top box may connect to a storage within a remote server, such as the server 120, hosted or otherwise used by the content provider, so as to acquire recorded content for later playback. The set-top box 110 may also include its own storage that allows for local storage of a content program that has been recorded, which can then be locally transmitted to the display device 100 upon request.

Because set-top boxes have significant circuitry provided therein, dissipation of heat (e.g., ensuring that heat can properly flow away from circuitry on a motherboard and so on) is desirable. That is, when an electronic device such as a set-top box gets overheated, components with thermal ratings that are less than a temperature that exists at or near such components can become degraded or otherwise damaged. Designers of set-top boxes consider Newton's law of cooling whereby a heat dissipation rate is proportional to the temperature difference between the set-top box and its surroundings, and design the set-top box whereby its operating temperature is limited. This can occur by artificially increasing a surface area of a high power density component.

Accordingly, such set-top boxes are often designed with a heat-spreader component such as an aluminum plate, so as to dissipate the heat across a large area. Such a configuration can result in a heat sink and can allow for more heat to be removed, or otherwise dissipated, from the set-top box, so as to lower device operating temperatures.

While utilizing a heat-spreader component may improve the heat dissipation within the set-top box, the relatively high temperatures that can exist within the set-top box during processing can be further abated by additional components. For example, a heat-dissipating sheet such as a carbon-containing sheet (e.g., a graphite sheet) may be further placed on or within the heat-spreader component to further improve the heat-dissipation qualities of the structure, and to ultimately allow for the processor within the motherboard of the set-top box to work at a lower temperature. However, while the heat-dissipating sheet can significantly improve the heat-dissipation characteristics of the system, the heat-dissipating sheet may be made of relatively weak materials, and may be subject to delamination or degradation when placed within the set-top box, especially during disassembly of the set-top box when components are pulled from each other. Thus, when a set-top box is disassembled to allow for replacement of particular parts or the like, further complications relating to the degradation of the heat-dissipating sheet may occur.

Set-top boxes also include thermally conductive insulators such as thermal pads. Thermal pads can be placed in particular locations so as to move heat away from a component, such as a chip or central processing unit (CPU) on the motherboard, that requires cooling. They can fill the gaps between surfaces (for example within the motherboard and the heat sink, such as the heat-spreader component and other components such as the heat-dissipating sheet disposed thereon) that need to contact each other for optimum heat dissipation.

Such thermal pads often come from a manufacturer with a layer of polymer covering an adhesive surface of the thermal pad, so as to provide protection to the thermal pad during transit, avoiding dirt and the like. Further, the layer of polymer may cover an adhesive surface of the thermal pad, so as to reduce the likelihood that the thermal pad adheres to something in an unwanted manner during shipping, packing or unpacking.

Still further, when the thermal pad is placed in the set-top box in the above-described configuration, it will adhere to both the components connected thereto given the adhesive nature of the surface existing after the removed protective layer of polymer, and the adhering or otherwise tight-fit connection from the opposite surface of the thermal pad to the respective component to which such a surface of the thermal pad is connected. During disassembly of the set-top box, for example to replace the thermal pad or some other component provided therein, the heat-dissipating sheet, which is made of multiple layers, some of which are relatively weak material, may become degraded or dissipated, either in view of the pulling pressure from the adhesive connection(s) of the thermal pad, or otherwise from the disassembler's pressure being placed on the cover and/or chassis during disassembly.

Thus, the heat-dissipating sheet may become degraded to the point where it is a liability in the set-top box, with particles reaching undesired locations and/or causing harm to other components, and otherwise making the heat-dissipating sheet unusable or ineffective. Further, the composition of the heat-dissipating sheet and its adherence (often by glue) to the heat-spreader component may make it particularly difficult to replace the heat-dissipating sheet when it loses its utility and needs replacement.

Accordingly, systems where the assembly and disassembly of the set-top box can occur while reducing and/or eliminating degradation of the heat-dissipating sheet are desirable.

Figure 2A:
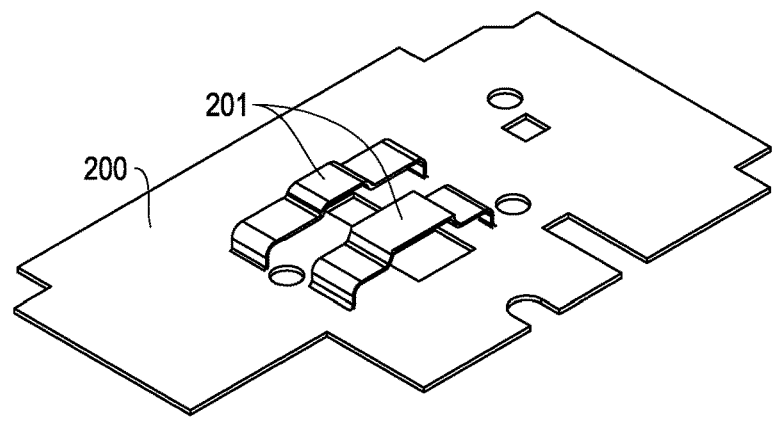
FIGS. 2A and 2B show diagrams of a heat spreader according to some embodiments.
Figure 2B:
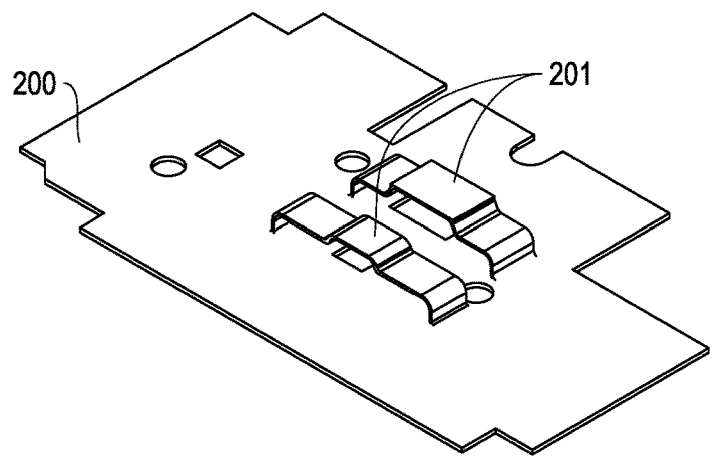

FIGS. 2A and 2B show a configuration of an exemplary heat-spreader component according to some embodiments. As shown in FIG. 2A, a heat-spreader component 200 is provided. The heat-spreader component may be, for example, a plate-like structure or generally plate-like structure and may extend across an entire length and entire width of the set-top box 110. In some embodiments, the heat-spreader component 200 includes a length that is greater than its width, and generally conforms to the generally rectangular shape of the set-top box 110. However, the heat-spreader component 200 may not extend the full length of the set-top box 110. In some embodiments, the heat-spreader component 200 may extend about 50%, or about 75%, or about 80%, or about 90%, or about 95% of the entire length of the set-top box 110. Accordingly, the heat-spreader component 200 may allow for heat dissipation along a majority of, but not necessarily an entirety of, the length of the set-top box 110.

Similarly, the heat-spreader component 200 may not extend the full width of the set-top box 110. In some embodiments, the heat-spreader component 200 may extend about 50%, or about 75%, or about 80%, or about 90%, or about 95% of the entire width of the set-top box 110. Accordingly, the heat-spreader component 200 may allow for heat dissipation along a majority of, but not necessarily an entirety of, the width of the set-top box 110.

The heat-spreader component 200 may be designed to fit within some contours of the set-top box 110, for example within some parts of a cover described later. The orientation of the heat-spreader component 200 is not particularly limited, but the heat-spreader component 200 may be longitudinally and/or axially offset from a center of the set-top box 110. In some configurations, the heat-spreader component 200 will be provided in a location closer to high-density heat-generating components within a motherboard of the set-top box 110 than to other components within the set-top box.

In some configurations, the heat-spreader component 200 functions as a heat sink to increase the heat dissipation rate within the set-top box 110. The heat-spreader component 200 may effectively artificially increase a surface area of high-density heat-generating components, so as to dissipate the heat generated from such components more efficiently.

In some embodiments, the heat-spreader component 200 may be made of aluminum, which advantageously has a relatively light weight and a useful thermal conductivity. The heat-spreader component 200 may be an aluminum plate given a generally flat, plate-like configuration. However, the heat-spreader component 200 may also be made of copper or another conductive metal as desired. In some embodiments, the heat-spreader component 200 may be made at least partially of aluminum and optionally of another metal such as copper, or an alloy or amalgamation of both metals.

In some embodiments, the heat-spreader component 200 is made of an extruded metal, such as extruded aluminum, but other techniques such as bonding, skiving, stamping, forging or computer-machining (e.g., CNC) may be used to manufacture the heat-spreader component 200. Further, the heat-spreader component 200 may be generally rectangular in nature, but may also be shaped with multiple different corners or edges so as to fit within the contours of a particular interior design of the cover of the set-top box 110.

As shown in FIG. 2A, the heat-spreader component 200 may have, connected thereto, at least one of the springs 201. These springs 201 may be fastened by screws, bolts, other mechanical adhesion, or electrical, thermal or chemical adhesion, to a surface of the heat-spreader component 200. The springs 201 may extend outward from the surface of the heat-spreader component 200 by a predetermined amount. The predetermined amount is not so limited, but may be, for example, about 1-50 millimeters, or about 5-25 millimeters or about 10-20 millimeters. The springs 201 may be made of a metal such as a conductive metal, for example copper. The springs 201 may also be made of bronze, phosphor bronze, or another metal or alloy. The springs 201 may also be considered bridges as they will allow for a thermal, or conductive, bridge across multiple components within the set-top box 110.

FIG. 2B shows a back view of the heat-spreader component 200 and the springs 201 according to the same embodiment.

Figure 3A:
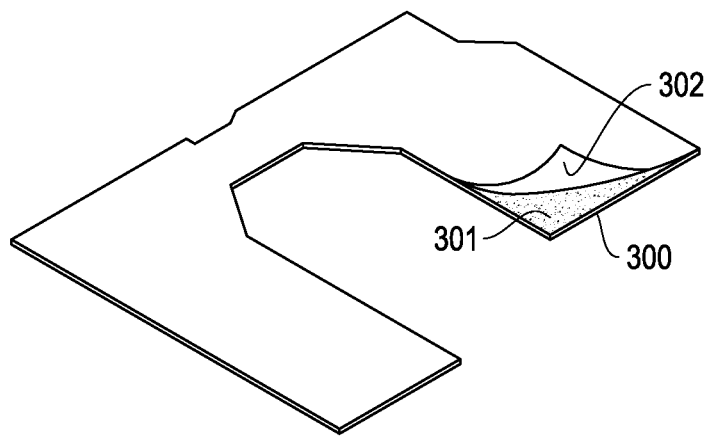
FIGS. 3A and 3B show diagrams of a graphite sheet according to some embodiments.
Figure 3B:
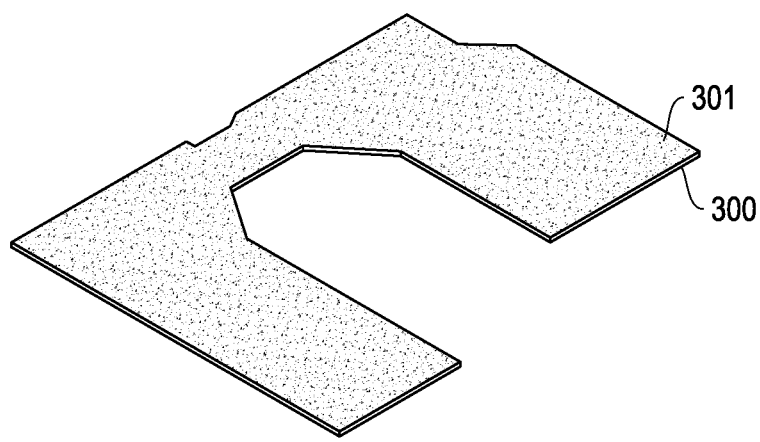

FIG. 3A shows a heat-dissipating sheet 300 according to some embodiments. The heat-dissipating sheet 300 may be provided, for example from a manufacturer, with an adhesive (sticky) surface 301 covered by a protective paper 302. FIG. 3B shows the same heat-dissipating sheet 300 with the protective paper 302 removed, which may occur by an assembler removing the paper after receiving the shipment of the heat-dissipating sheet 300, for example during assembly of the set-top box 110.

The heat-dissipating sheet 300 may be made of a carbon-containing material, and in some examples may be a graphite sheet. The adhesive surface 301 may be made of glue or another adhesive, and may be only on one surface of the heat-dissipating sheet 300, with the other surface of the heat-dissipating sheet 300 being non-adhesive or less adhesive.

The heat-dissipating sheet 300 may have a generally flat, plate-like configuration and may be sized to fit in particular contours of the heat-spreader component 200. In some embodiments, multiple, smaller heat-dissipating sheets 300 will be provided so that they can be more easily maneuvered and placed at different locations on the surface of the heat-spreader component 200. However, in other embodiments, the heat-dissipating sheet 300 may be a singly manufactured sheet that can be fit within particular locations on the heat-spreader component. Further, the heat-dissipating sheet 300 may come as a single sheet that can be cut to size or into multiple smaller sheets by an assembler or other contractor tasked with assembling the set-top box 110.

In embodiments where the heat-dissipating sheet 300 is a graphite sheet, the graphite serves as a compressible, porous, electrically and thermally conductive material that can improve the heat-dissipation characteristics of the set-top box 110, with ease of manufacture and assembly for the set-top box 110.

Figure 4:
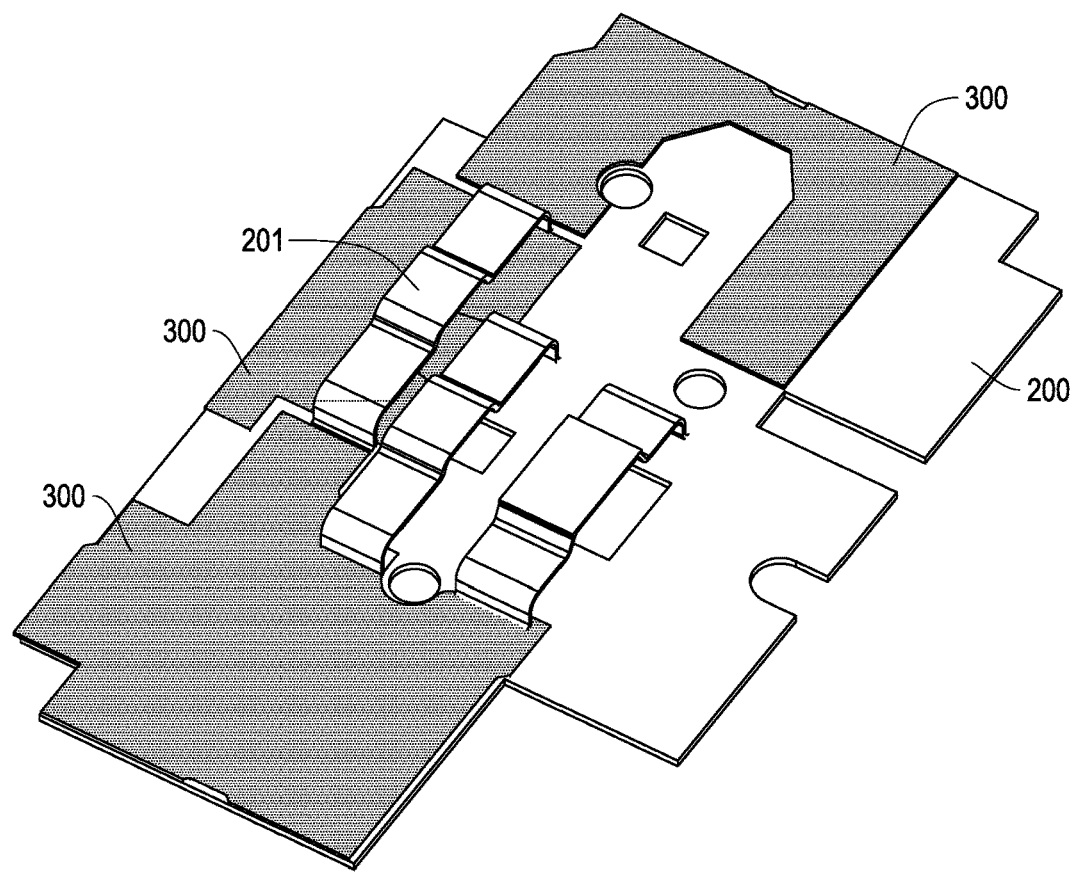
FIG. 4 shows a diagram of the heat spreader and graphite sheet according to some embodiments.

As shown in FIG. 4, the heat-spreader component 200 is provided with the heat-dissipating sheet 300 provided thereon. As an example, the adhesive surface 301 of the heat-dissipating sheet is adhered to an upper surface of the heat-spreader component 200. While not limited, FIG. 4 shows an example whereby four pieces of heat-dissipating sheet 300 are provided at various locations on the upper surface of the heat-spreader component 200. The heat-dissipating sheet 300 may be manufactured and/or otherwise cut into size to fit contours of the upper surface of the heat-spreader component 200. In some examples, for example as shown in FIG. 4, the heat-dissipating sheet 300 will contour around bottom surfaces of the springs 201, and may cover a majority of the surface area of the heat-spreader component 200 except for the area already covered by the springs 201. In some examples, the heat-dissipating sheet 300 may also be provided on an outer (e.g., top as shown in FIG. 4) surface of the springs 201.

For example, the heat-dissipating sheet 300 may cover about 50%, or about 75%, or about 80%, or about 90% of the surface area of the upper surface of the heat-spreader component 200. This may advantageously improve heat-dissipation qualities. The heat-dissipating sheet 300 may be configured around longitudinal ends of the bottom surface of the springs 201, but may be omitted in an area under the springs 201, for example to improve ease of manufacturing. However, embodiments where an entirety of the upper surface of the heat-spreader component 200 with the exception of connection points of the springs 201 may be covered with the heat-dissipating sheet 300 are also within the scope of this disclosure. The springs 201 themselves may also be covered with the heat-dissipating sheet 300, which may further improve the coverage area of the heat-dissipating sheet 300.

Further, while three springs 201 are shown in FIG. 4, this disclosure is not so limited. One spring 201, or two springs 201, or four or more springs 201 may be utilized within the set-top box 110. The springs 201 may aid in assembly of the set-top box 110, for example assisting in a snap-fit and/or spring-based and/or other type of closure of the set-top box 110 to complete manufacturing, but may be omitted in other instances where another closure method is provided.

Figure 5:
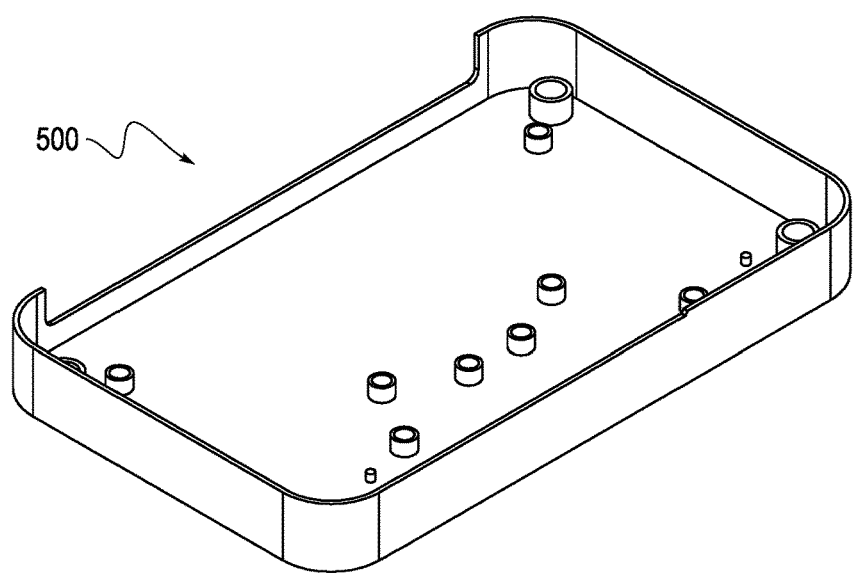
FIG. 5 shows a diagram of a cover according to some embodiments.

FIG. 5 shows a cover 500. The cover 500, shown for assembly in an upside-down configuration relative to its normal use in FIG. 5, may receive the combination of the heat-dissipating sheet 300 and heat-spreader component 200 (with the springs 201 optionally included as part of the heat-spreader component 200) described in FIG. 4. The cover may be provided with one or more of contours, grooves, pegs, pins, and/or other male and/or female connections to interact with at least one of the heat-dissipating sheet 300, heat-spreader component 200, and other components of the set-top box 110 that will ultimately be attached thereto.

When the set-top box 110 is in its fully assembled configuration, the cover may amount to an uppermost part, including an upper surface, of the set-top box 110.

Figure 6:
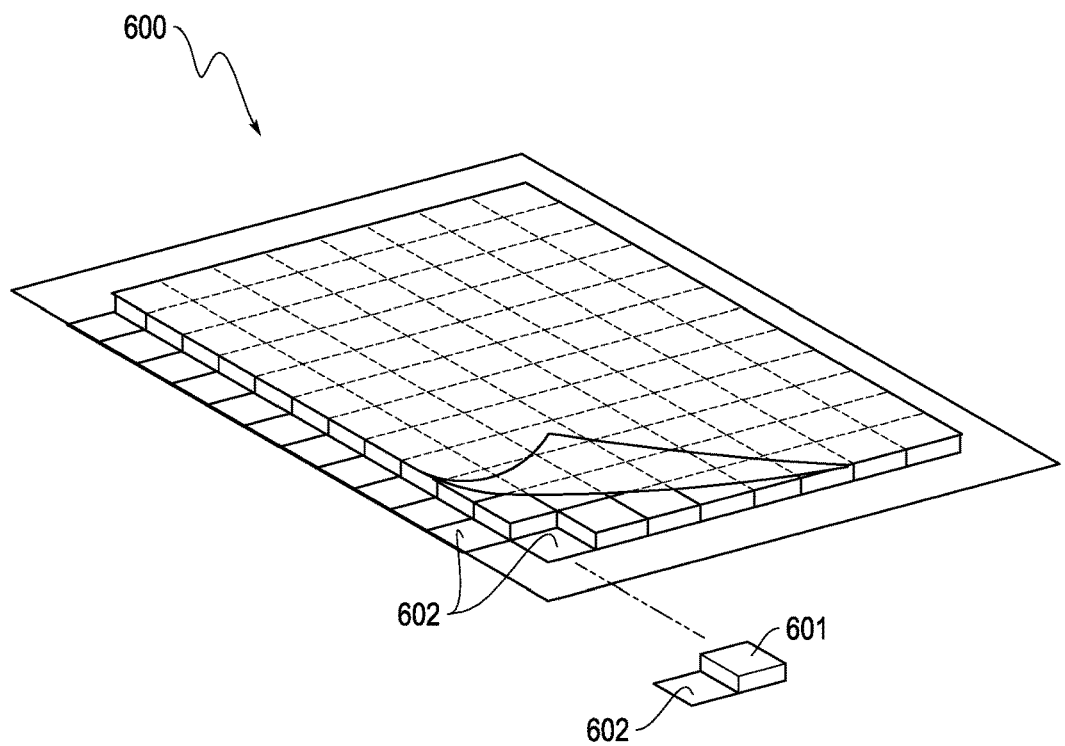
FIG. 6 shows a diagram of a thermal pad according to some embodiments.

FIG. 6 shows an example of a thermal pad 600. The thermal pad 600 includes, for example, individual shapes 601 that may be, for example, die-cut or otherwise cut by a manufacturer. The individual shapes 601 can thus be detached from other parts of the thermal pad 600 and used in the assembly of the set-top box 110. The thermal pad 600, and each of the individual shapes 601, may also include at least one layer of polymer 602 attached thereto. The at least one layer of polymer may amount to, for example, a film and may be provided from a manufacturer to be a protective component that serves to protect the thermal pad 600 and individual shapes 601 thereof during packaging and/or shipping. The thermal pad 600 may be made of a thermally conductive silicone elastomer, or some other high-conductivity material. In some embodiments, the thermal pad may also include one or more of graphite, acrylic, polyester, aluminum, fiberglass, either in addition to, in lieu of, or concurrently with silicone. The thermal pad 600 may be oriented in such a manner so as to aid in dissipating heat from a heat source (e.g., the circuitry and/or processor within the motherboard, described later) to a heat sink (e.g., one or both of the heat-dissipating sheet 300 and heat-spreader component 200, optionally also with the springs 201), to protect the set-top box 110 from overheating.

The at least one layer of polymer 602 may be made of a material. In some embodiments, the material is polyethylene terephthalate (PET), which may be a material already provided as the protective component by the manufacturer. However, the at least one layer of polymer 602 may additionally or alternatively include a synthetic material from the field of thermoplastics, for example a hard plastic constituted by a styrene polymerisate like, for example, styrene acrylonitrile (SAN) or polystyrene (PS) or acrylonitrile butadiene styrene (ABS) or styrene methyl methacrylate (SMMA) or styrene butadiene (SB), and/or a polyolefin like, for example, polypropylene (PP) or a polyethylene (PE), such as high-density or low-density polyethylene (HDPE/LDPE), and/or a polyester like, for example, in particular acid-modified or glycol-modified, or polybutylene terephthalate (PBT) or acid-modified polycyclohexylene dimethylene terephthalate (PCT-A) or glycol-modified polycyclohexylene dimethylene terephthalate (PCT-G), and/or a cellulose derivate, e.g. cellulose acetate (CA) or cellulose acetobutyrate (CAB) or cellulose propionate (CP) or cellulose acetate phthalate (CAP) or cellulose butyral (CB), and/or a polyamide (PA), like PA 6.6 or PA 6.10 or PA 6.12, and/or poly (methylmethacrylate) (PMMA) and/or polycarbonate (PC), and/or polyoxymethylene (POM) and/or polyvinyl chloride (PVC) and/or polyurethane (PUR). Such materials may also be provided by a manufacturer, including the manufacturer of the thermal pad 600, for the same purposes as when the material of the at least one layer of polymer 602 is PET.

In some embodiments, the at least one layer of polymer 602 may not substantially reduce a thermal transfer rate between the individual shapes 601 of the thermal pad 600 and other components such as the heat-spreader component 200 with the heat-dissipating sheet 300. That is, while the at least one layer of polymer 602 may have insulating characteristics, it may be very thin (0.1 mm or 0.01 mm or less) and not substantially reduce thermal transfer. Further, the insulating nature of the at least one layer of polymer 602 may not substantially degrade desirable electronic characteristics within the set-top box 110, given its placement and relatively low thickness. Thus, the presence of the at least one layer of polymer 602 may allow the thermal pad 600 and individual shapes 601 thereof to function as intended, ensuring heat transfer to the other components such as the heat-spreader component 200 with the heat-dissipating sheet 300.

Still further, the at least one layer of polymer 602 may also have a strong temperature resilience and might not deform or fatigue to a substantial extent even when dealing with the high temperatures inside the set-top box 110. These advantages may be particularly notable when the at least one layer of polymer 602 includes PET.

Figure 7A:
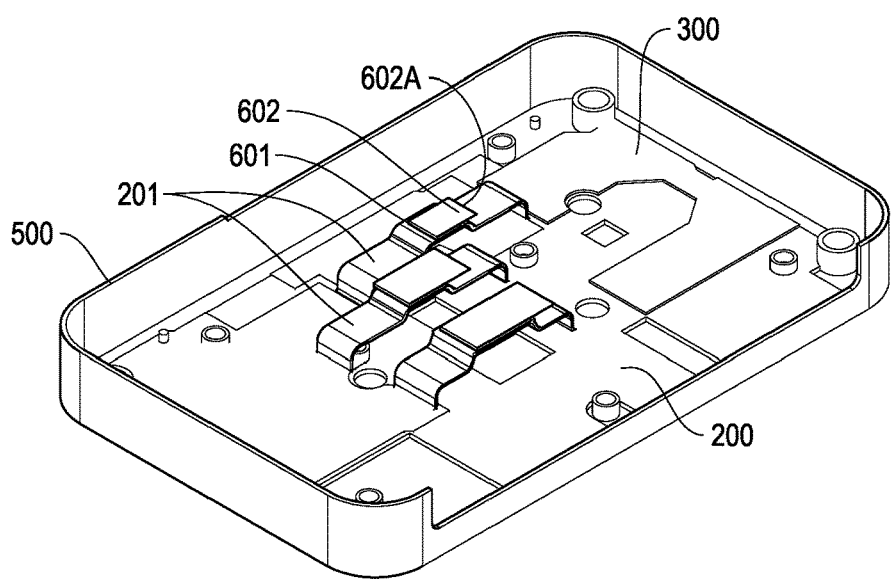
FIGS. 7A and 7B show diagrams of the heat spreader, graphite sheet, cover and thermal pad according to some embodiments.
Figure 7B:
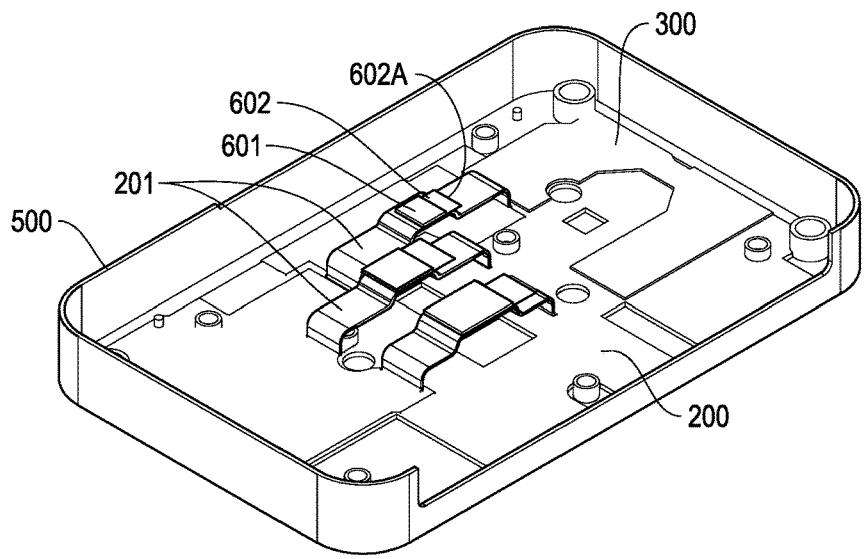

FIGS. 7A and 7B shows a configuration of a partially assembled set-top box 110 according to some embodiments. In FIGS. 7A and 7B, the cover 500 is shown at the bottom of FIGS. 7A and 7B, with the heat-spreader component 200 attached thereto. The heat-spreader component 200 may be attached to the cover 500 by mechanical connection, e.g., by fitting the heat-spreader component 200 around pins and/or other parts of the cover 500, including a connection such as a snap-fit connection around some other components. However, the heat-spreader component 200 may also be affixed to a surface of the cover 500 or other parts extending from the cover 500 by glue, other adhesive, or chemical or electrical bonding or the like.

The heat-spreader component 200 includes one or more pieces of heat-dissipating sheet 300 assembled thereon, for example in the manner discussed previously with reference to FIG. 4.

FIGS. 7A and 7B also shows the individual shapes 601 of the thermal pad 600 disposed within the set-top box 110. In the example shown in FIGS. 7A and 7B, individual shapes 601 are provided on upper surfaces of springs 201. The individual shapes 601 of thermal pad 600 may be individually sized to cover a majority of or an entirety of the upper surface of the respective springs 201. Further, a portion of the heat-dissipating sheet 300 (e.g., graphite sheet, for example) may be placed on the upper surface of the springs 201, with the individual shapes 601 thus placed atop the heat-dissipating sheet 300, with the heat-dissipating sheet 300 being between the respective springs 201 and individual shapes 601.

The individual shapes 601 may be adhered to and/or otherwise directly contacting the upper surface of the springs 201 or the heat-dissipating component attached thereto by an adhesive, either an adhesive that is manufactured with the individual shapes 601, or an adhesive that is added on during assembly of the set-top box 110. Further, the individual shapes 601 may simply be placed on the upper surface of the respective springs 201, or using another type of mechanical adhesive or using a chemical or electrical adhering procedure.

In FIG. 7A, the at least one layer of polymer 602 is shown on a first surface, such as an upper surface (relative to the positioning as shown in FIG. 7A) or outer surface of each of the individual shapes 601. In the embodiment shown in FIG. 7A, the at least one layer of polymer 602 includes a tab 602A that extends beyond an outer edge of the respective individual shapes 601, which may improve ease of assembly and disassembly, and ease of transporting and placing the individual shapes 601. The tab 602A may also provide easy visualization to the manufacturer of the set-top box 110 to confirm that the at least one layer of polymer 602 is properly in place.

Alternatively, the at least one layer of polymer 602 can be shown without the tab 602A, which may reduce cost given the less material being used. That is, the at least one layer of polymer 602 may be sized to match, in perimeter and area, with the respective individual shapes 601.

While the upper surface of the individual shapes 601 is described as the "top" surface of individual shapes 601 in FIG. 7A, one skilled in the art would recognize that after assembly of the set-top box 110, where the cover 500 is now the top of the assembly, the "upper surface" of the individual shapes 601 may become the bottom surface of the individual shapes when in use. Thus, the terms upper and lower surfaces are used with reference herein to the Figures for ease of understanding, and should not be considered limiting.

In some embodiments, the surface of the at least one layer of polymer 602 that is opposite the individual shapes 601 (e.g., the top surface of the at least one layer of polymer 602 as shown in FIG. 7A) is not a tacky surface and does not adhere to other components ultimately attached thereto. This will improve the ease of disassembly of the set-top box and will avoid the at least one layer of polymer 602 (or the individual shapes 601) inadvertently adhering to other components during assembly and/or disassembly, which may cause separation within the heat-dissipating sheet 300 as discussed earlier.

FIG. 7B shows an alternative arrangement of the individual shapes 601 and the at least one layer of polymer 602. While the other components are oriented similarly as in FIG. 7A, the at least one layer of polymer 602 and tab 602A extending therefrom are now provided on the second (e.g., lower, relative to the positioning as shown in FIG. 7B) surface of the respective individual shapes 601. That is at least one layer of polymer 602 directly contacts the respective springs 201, and is provided in between the respective individual shapes 601 and the springs 201.

Again, the surface of the at least one layer of polymer 602 that is opposite the individual shapes 601 (e.g., the bottom surface of the at least one layer of polymer 602 as shown in FIG. 7B) is not a tacky surface and does not adhere to spring 201 as shown in FIG. 7B and/or heat-dissipating sheet 300 in a case that the individual shapes 601 are placed between the area 803 and the spring 201 and/or heat-dissipating sheet 300. Similarly, as shown in FIG. 7A, the at least one layer of polymer 602 is not a tacky surface and thus would not adhere to the area 803 in the case that the individual shapes 601 are provided on the area 803. This will also improve the ease of disassembly of the set-top box and will avoid the at least one layer of polymer 602 (or the individual shapes 601) inadvertently adhering to other components during assembly and/or disassembly, which may cause separation within the heat-dissipating sheet 300 as discussed earlier.

Thus, either the individual shapes 601 of the thermal pad 600 or the at least one layer of polymer 602 will directly contact the area 803 within the motherboard 802 or some other part of the motherboard 802 or a chip or circuitry disposed therewithin, and the other of the individual shapes 601 of the thermal pad 600 or the at least one layer of polymer 602 will directly contact the spring 201 or the heat-dissipating sheet 300 disposed thereon.

Figure 8:
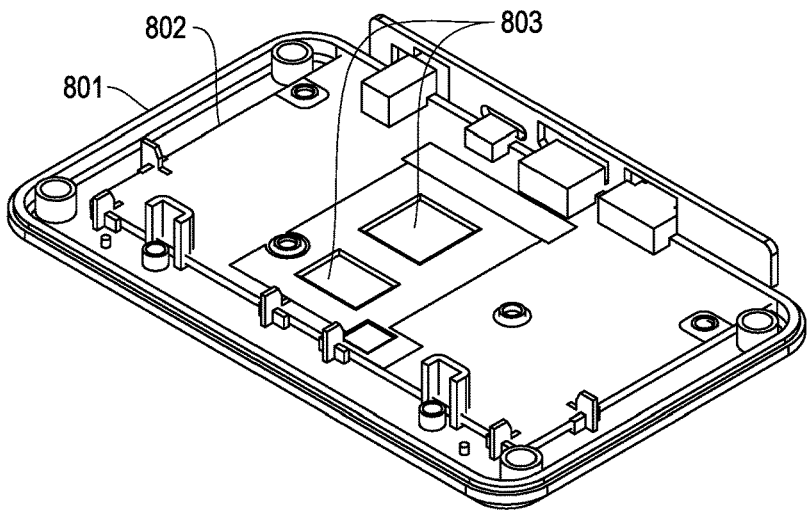
FIG. 8 shows a diagram of a chassis and motherboard according to some embodiments.

FIG. 8 shows another portion of the set-top box 110 according to some embodiments. FIG. 8 shows a base (e.g., chassis) 801, with a motherboard 802 fit therein. The motherboard 802 will include various circuitry to allow for the set-top box 110 to operate as intended, for example to communicate with the display device 100 and/or server 120, and to transmit and receive data therebetween so as to allow for a viewer to view content on the display device. Within the motherboard 802 is a hardware processor such as a central processing unit CPU which may be programmed to allow the set-top box 110 to carry out its intended functionality. One or more of the components of the motherboard 802 may be heat-generating components such as high-density heat-generating components.

FIG. 8 also shows a metal component such as a metal plate attached within the motherboard 802, the metal plate including at least one area 803 (with two areas 803 shown in FIG. 8). The at least one area 803 may receive a respective one of the individual shapes 601, with the at least one layer of polymer 602 attached thereto, when assembly of the set-top box 110 is completed. In some embodiments, the at least one area 803 is a part of the metal component, and may be a grooved portion or flat portion or other portion of the metal component sized to receive the individual shapes 601. However, the at least one area 803 may also be a different part configured to receive the individual shapes 601, for example on or within some other component that may or may not generate heat, such as the processor within the motherboard 802 or some other part of the motherboard 802. In some embodiments, the at least one area 803 is some area of the motherboard 802, and the metal component such as the metal plate is not included.

Figure 9A:
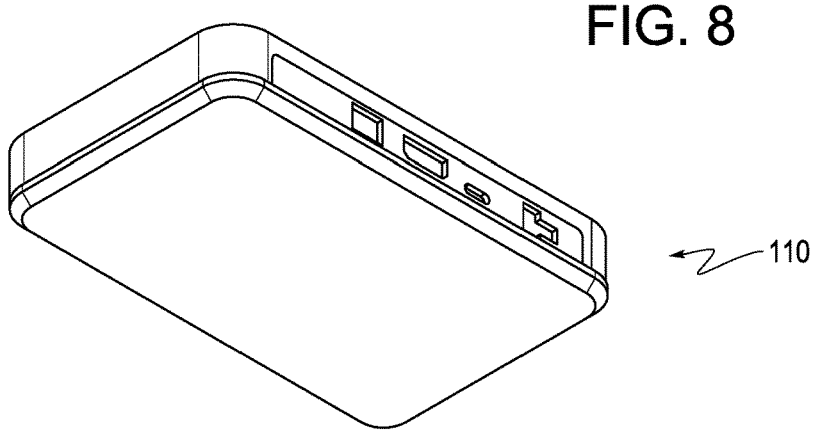
FIGS. 9A and 9B show diagrams of an electronic assembly according to some embodiments.
Figure 9B:
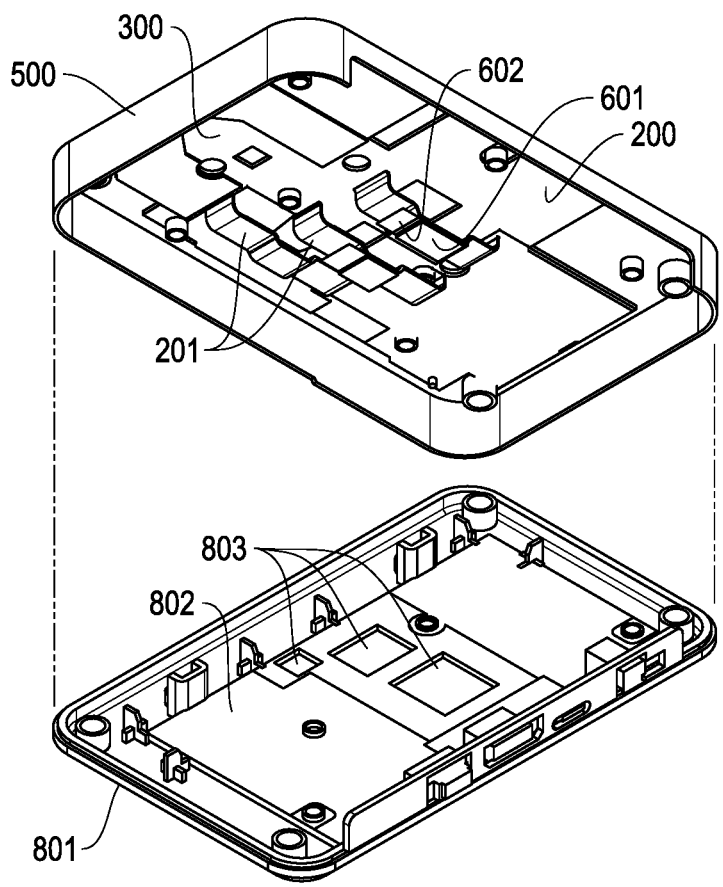

FIG. 9A shows the set-top box 110 in a fully assembled configuration. As shown in FIG. 9B, the internal configuration of the set-top box 110 can include, from top to bottom, the cover 500, the heat-spreader component 200, the heat-dissipating sheet 300, springs 201 (optionally with a part of the heat-dissipating sheet 300 attached on the lower-facing surface of the springs 201), the individual shapes 601 of the thermal pad 600 and the at least one layer of polymer 602 (or, alternatively, the at least one layer of polymer 602 and then the individual shapes 601), the area 803 of the motherboard 802, the motherboard 802, and the chassis 801. During assembly and particularly disassembly of the set-top box 110, the individual shapes 601 of the thermal pad 600 will not continue adhering to both the spring (and/or heat-dissipating sheet 300 attached thereto) and the area 803 part of the motherboard 802, given that only, at most, one adhesive part of the individual shapes 601 remains in contact with the motherboard 802 or spring 201, and the inclusion of the at least one layer of polymer 602 with a nonadhesive or less adhesive part will prevent unintended sticking during assembly or disassembly. Thus, the likelihood of layers of the heat-dissipating sheet 300 becoming separated during assembly or disassembly are reduced, and costs for replacement are reduced and the utility and life of the set-top box 110 can be improved.

Figure 10:
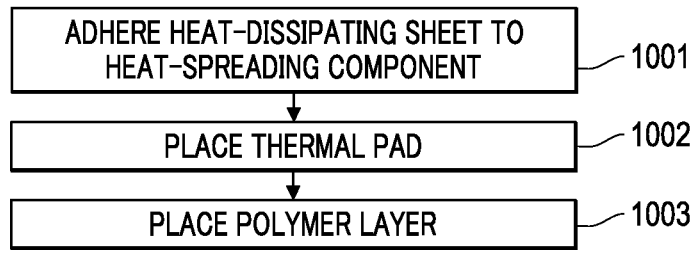
FIG. 10 shows a flow diagram of a method of assembling an electronic assembly according to some embodiments.

FIG. 10 shows a method of assembly of the set-top box 110. As described more explicitly with reference to the embodiments discussed herein, the method includes a step 1001 of adhering a heat-dissipating sheet, for example, the heat-dissipating sheet 300 such as a graphite or other carbon-containing sheet discussed herein, onto a surface of a heat-spreader component, for example, the heat-spreader component 200 discussed herein. The adhering may occur by removing a protective layer of the heat-dissipating sheet and sticking the heat-dissipating sheet to the surface of the heat-spreader component. The heat-spreader component may be metal.

The method further includes a step 1002 of placing a thermal pad, which may be the one or more individual shapes such as individual shapes 601 discussed herein, on at least one component, which may be the spring 201 discussed herein, extending from the surface of the heat-spreader component. The method includes a step 1003 of placing at least one layer of polymer, which may be the at least one layer of polymer 602 so as to directly contact at least one of an upper surface and a lower surface of the thermal pad.

The steps 1002 and 1003 may be performed concurrently, if, for example, the at least one polymer layer is already connected to the individual shapes 601. That is, the steps 1002 and 1003 may occur in a single step. This may be particularly advantageous in a case, where, for example, the at least one polymer layer is used as a protective film during shipment of the thermal pad, and thus, the same at least one polymer layer can be used in assembly and not discarded. Either the thermal pad or the at least one polymer layer will directly contact a component within a motherboard that includes circuitry for the set-top box (e.g., the area 803 within the motherboard 802) or some other part of the motherboard or a chip or circuitry disposed therewithin, and the other of the thermal pad and at least one polymer layer will directly contact the component (e.g., spring 201) or the heat-dissipating sheet (e.g., heat-dissipating sheet 300).

Although specific embodiments were described herein, the scope of the invention is not limited to those specific embodiments. The scope of the invention is defined by the following claims and any equivalents therein. As will be appreciated by one skilled in the art, aspects of the present disclosure may be embodied as an apparatus, system or method.

Aspects of the present disclosure are described above with reference to flowchart illustrations and block diagrams of methods and apparatuses according to embodiments of the disclosure. It will be understood that each block of the flowchart illustrations and/or block diagrams, and combinations of blocks in the flowchart illustrations and/or block diagrams, can be implemented various parts of the system and/or method.

The flowcharts and block diagrams in the Figures illustrate the architecture, functionality, and operation of possible implementations of apparatuses and methods according to various embodiments of the present disclosure. In this regard, each block in the flowchart or block diagrams may represent a module, segment, or portion the method or apparatus, and the functions noted in the block may occur out of the order noted in the Figures. For example, two blocks shown in succession may, in fact, be executed substantially concurrently, or the blocks may sometimes be executed in the reverse order, depending upon the functionality involved.

What is claimed is:

1. An electronic assembly, comprising:
a heat-spreader component;
at least one spring coupled to the heat-spreader component;
a thermal pad having a first surface and a second surface that is opposite the first surface; and
at least one layer of polymer directly contacting the first surface of the thermal pad,
wherein:
the at least one layer of polymer is not adhesive to components of the electronic assembly,
the second surface of the thermal pad is exposed and is adhesive to components of the electronic assembly,
the thermal pad is disposed on the at least one spring such that the at least one layer of polymer directly contacts the at least one spring, and
in use of the electronic assembly, the at least one layer of polymer remains directly contacting the at least one spring.

2. The electronic assembly according to claim 1, further comprising a motherboard, the motherboard comprising a metal component, wherein the thermal pad is disposed in an area of the metal component.

3. The electronic assembly according to claim 2, wherein the thermal pad contacts a further component of the electronic assembly including circuitry on the motherboard.

4. The electronic assembly according to claim 2, further comprising a heat-dissipating sheet.

5. The electronic assembly according to claim 4, wherein the heat-dissipating sheet comprises graphite.

6. The electronic assembly according to claim 4, further comprising a cover and a chassis.

7. The electronic assembly according to claim 4, wherein:
the at least one spring directly contacts and extends outward from the heat-spreader component,
the heat-dissipating sheet is provided on the heat-spreader component on a first surface of the at least one spring and at least one location separate from the first surface of the at least one spring,
the thermal pad is disposed on the first surface of the at least one spring such that the at least one layer of polymer directly contacts the heat- dissipating sheet provided on the first surface of the at least one spring.

8. The electronic assembly according to claim 7, wherein:
the thermal pad contacts a further component of the electronic assembly in the area of the metal component.

9. The electronic assembly according to claim 1, wherein the at least one layer of polymer includes polyethylene terephthalate.

10. The electronic assembly according to claim 1, wherein the thermal pad comprises a thermally conductive silicone elastomer.

11. The electronic assembly according to claim 1, wherein the at least one layer of polymer extends laterally beyond an outer edge of the first surface of the thermal pad to form a tab.

12. The electronic assembly according to claim 1, wherein an area and a perimeter of the at least one layer of polymer are substantially equal to an area and a perimeter, respectively, of the thermal pad.

13. A method of assembling an electronic assembly, comprising:
placing a thermal pad on at least one spring extending from a surface of a heat-spreader component, the thermal pad having a first surface, a second surface that is opposite the first surface, and at least one layer of polymer directly contacting the first surface,
wherein:
the at least one layer of polymer is not adhesive to components of the electronic assembly,
the second surface of the thermal pad is exposed and is adhesive to components of the electronic assembly,
the placing the thermal pad on the at least one spring comprises placing the at least one layer of polymer in direct contact with the at least one spring, and placing the second surface of the thermal pad in direct contact with a further component of the electronic assembly, and
in use of the electronic assembly after the electronic assembly is assembled, the at least one layer of polymer remains directly contacting the first surface of the thermal pad.

14. The method according to claim 13, wherein the placing the thermal pad on the at least one spring comprises receiving the thermal pad and the at least one layer of polymer from a packaging in which the at least one layer of polymer directly contacts the first surface of the thermal pad, and the thermal pad and the at least one layer of polymer are together placed on the at least one spring in a single step.

15. A method of assembling an electronic assembly, comprising:
adhering a heat-dissipating sheet on a surface of a heat-spreader component;
placing a thermal pad on at least one spring extending from the surface of the heat-spreader component;
placing at least one layer of polymer so as to directly contact at least one of an upper surface or a lower surface of the thermal pad; and
disposing the heat-dissipating sheet, the thermal pad, and the at least one layer of polymer within a cover,
wherein the thermal pad and the at least one layer of polymer are placed within a groove on a motherboard when the cover is fit to a chassis.

16. The method according to claim 15, wherein the thermal pad directly contacts the groove.

17. The method according to claim 15, wherein the at least one layer of polymer directly contacts the groove.

* * * * *